(12) United States Patent
Lim

(10) Patent No.: US 10,168,370 B2
(45) Date of Patent: Jan. 1, 2019

(54) SEMICONDUCTOR APPARATUS AND TEST SYSTEM INCLUDING THE SAME

(71) Applicant: SK hynix Inc., Icheon-si, Gyeonggi-do (KR)

(72) Inventor: Sang Oh Lim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 546 days.

(21) Appl. No.: 14/569,908

(22) Filed: Dec. 15, 2014

(65) Prior Publication Data

US 2016/0087428 A1 Mar. 24, 2016

(30) Foreign Application Priority Data

Sep. 23, 2014 (KR) ........................ 10-2014-0126883

(51) Int. Cl.
*G01R 31/00* (2006.01)
*G11C 29/56* (2006.01)
*G11C 29/26* (2006.01)

(52) U.S. Cl.
CPC ............ *G01R 31/001* (2013.01); *G11C 29/56* (2013.01); *G11C 2029/2602* (2013.01); *G11C 2029/5602* (2013.01)

(58) Field of Classification Search
None
See application file for complete search history.

(56) References Cited

U.S. PATENT DOCUMENTS

| 5,159,518 A * | 10/1992 | Roy ..................... H01L 27/0255 257/357 |
| 5,625,522 A * | 4/1997 | Watt ..................... H01L 27/0251 361/111 |
| 5,818,086 A * | 10/1998 | Lin ..................... H01L 27/0248 257/174 |
| 5,978,197 A * | 11/1999 | Chan ..................... G01R 31/001 324/686 |
| 6,344,960 B1 * | 2/2002 | Seo ..................... H01L 27/0266 361/111 |
| 7,692,905 B2 * | 4/2010 | Hung ..................... H01L 27/0266 361/111 |
| 8,755,157 B2 * | 6/2014 | Son ..................... H01L 27/027 361/118 |
| 8,982,517 B2 * | 3/2015 | Torres ..................... H02H 9/046 361/56 |
| 2008/0198517 A1 * | 8/2008 | Son ..................... H02H 9/046 361/56 |
| 2008/0204952 A1 * | 8/2008 | Hung ..................... H02H 9/046 361/56 |

(Continued)

FOREIGN PATENT DOCUMENTS

JP 2005093497 A * 4/2005 ............. H02H 9/046
KR 1020090030407 A 3/2009

*Primary Examiner* — Paresh H Patel
(74) *Attorney, Agent, or Firm* — William Park & Associates Ltd.

(57) ABSTRACT

A semiconductor apparatus includes an input/output pad configured to exchange signals with an external device; a control pad configured to be inputted with a discharge signal from the external device; and a first electrostatic protection unit configured to form an electrostatic discharge path from the input/output pad to a first voltage supply line according to the discharge signal.

13 Claims, 7 Drawing Sheets

(56) References Cited

U.S. PATENT DOCUMENTS

2009/0086393 A1* 4/2009 Watanabe ............. H02H 9/046
361/56
2012/0008424 A1* 1/2012 Lim ....................... G11C 16/26
365/189.05

* cited by examiner

SEMICONDUCTOR APPARATUS AND TEST SYSTEM INCLUDING THE SAME

CROSS-REFERENCES TO RELATED APPLICATION

The present application claims priority under 35 U.S.C. § 119(a) to Korean application number 10-2014-0126883, filed on Sep. 23, 2014, in the Korean Intellectual Property Office, which is incorporated herein by reference in its entirety.

BACKGROUND

1. Technical Field

Various embodiments generally relate to a semiconductor apparatus and a test system including the same, and more particularly, to a test system capable of simultaneously testing a plurality of semiconductor apparatuses.

2. Related Art

Integrated circuits, semiconductor-based electronic devices, are used for a variety of devices, including semiconductor memories. There are two types of semiconductor memories: a nonvolatile type and a volatile type.

In a nonvolatile memory device, stored data may be retained even in absence of power supply. Nonvolatile memory devices include flash memory devices, FeRAM (ferroelectric random access memory) devices, PCRAM (phase change random access memory) devices, MRAM (magnetic random access memory) devices, and ReRAM (resistive random access memory) devices.

In contrast, a volatile memory device requires power to maintain the stored data. The volatile memory device, which is generally faster, may be used in a data processing system as a buffer memory device, a cache memory device, or a working memory device. Volatile memory devices include SRAM (static random access memory) devices and DRAM (dynamic random access memory) devices.

SUMMARY

In an embodiment of the invention, a semiconductor apparatus may include an input/output pad configured to exchange signals with an external device. The semiconductor apparatus may also include a control pad configured to be inputted with a discharge signal from the external device. Further, the semiconductor apparatus may include a first electrostatic protection unit configured to form an electrostatic discharge path from the input/output pad to a first voltage supply line according to the discharge signal.

In an embodiment of the invention, a semiconductor apparatus may include an input/output pad configured to exchange signals with an external device. The semiconductor apparatus may also include a control pad configured to be inputted with a control signal from the external device in a test mode. Further, the semiconductor apparatus may include a discharge signal output unit configured to output a discharge signal according to the control signal. The semiconductor apparatus may also include a first electrostatic protection unit configured to form an electrostatic discharge path from the input/output pad to a first voltage supply line according to the discharge signal.

In an embodiment of the invention, a test system may include a plurality of semiconductor apparatuses. The test system may also include a test device configured to test the plurality of semiconductor apparatuses. Each of the plurality of semiconductor apparatuses comprise: an input/output pad configured to exchange signals with the test device; a control pad configured to be inputted with a discharge signal from the test device; and an electrostatic protection unit configured to form an electrostatic discharge path from the input/output pad to a voltage supply line according to the discharge signal.

DETAILED DESCRIPTION

Hereinafter, a semiconductor apparatus and a test system including the same will be described below with reference to the accompanying drawings through various embodiments.

Figure 1:
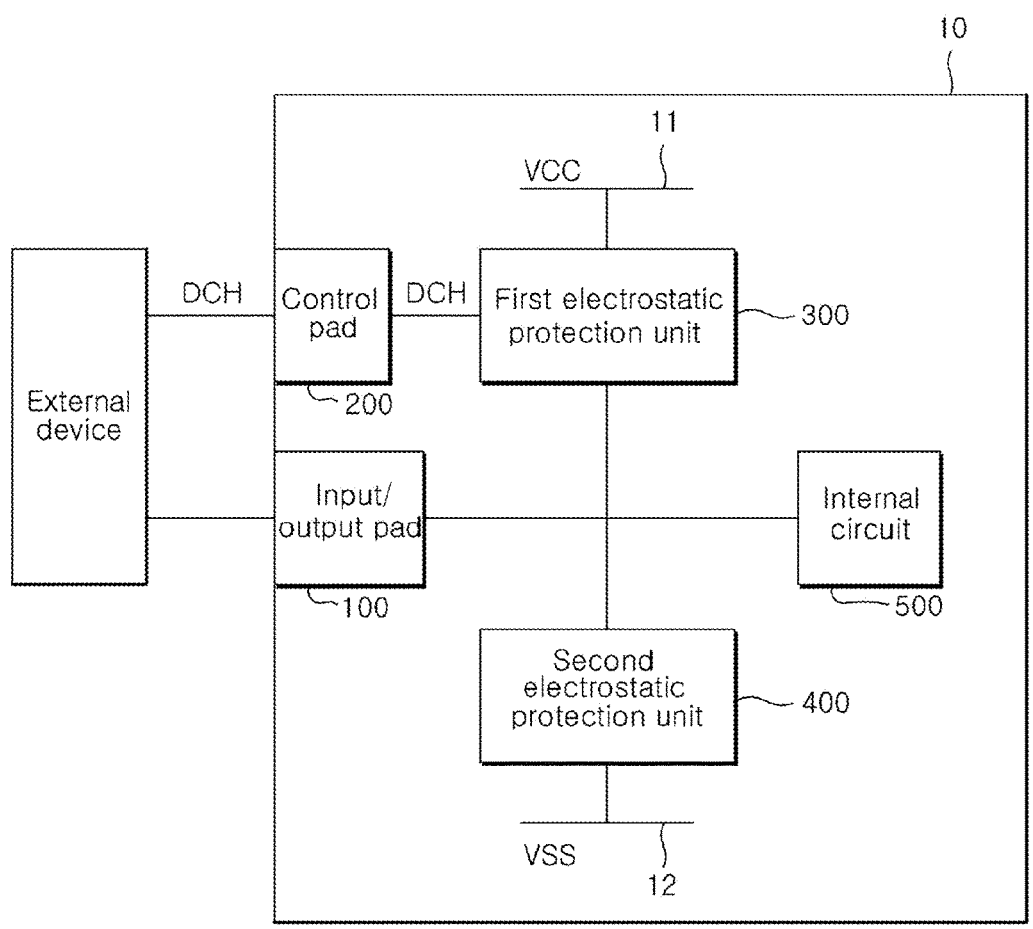
FIG. 1 is a block diagram schematically illustrating a representation of an example of a semiconductor apparatus in accordance with an embodiment.

Referring to FIG. 1, a block diagram schematically illustrating a representation of an example of a semiconductor apparatus 10 in accordance with an embodiment is shown.

The semiconductor apparatus 10 may include an input/output pad 100, a control pad 200, and a first electrostatic protection unit 300.

The input/output pad 100 may be configured to exchange signals with an external device. The input/output pad 100 may be inputted with a signal from the external device. The input/output pad 100 may output a signal to the external device. As will be described later, in the case where the signal inputted through the input/output pad 100 is within a normal voltage level range, the signal may be transmitted to an internal circuit 500.

The control pad 200 may be configured to be inputted with a discharge signal DCH from the external device. The discharge signal DCH inputted through the control pad 200 may be transmitted to the first electrostatic protection unit 300.

The first electrostatic protection unit 300 may be configured to form an electrostatic discharge path from the input/output pad 100 to a first voltage supply line 11 in response to the discharge signal DCH. The first electrostatic protection unit 300 may form a single directional current path from the input/output pad 100 to the first voltage supply line 11 in response to the discharge signal DCH. The first electrostatic protection unit 300 may also thereby remove the static electricity generated in the input/output pad 100. The first electrostatic protection unit 300 may electrically decouple the input/output pad 100 and the first voltage supply line 11 in response to the discharge signal DCH which is disabled.

The first voltage supply line 11 may be configured to be supplied with a positive voltage, for example, a power supply voltage VCC, through a first voltage pad.

The semiconductor apparatus 10 may further include a second electrostatic protection unit 400. The second electrostatic protection unit 400 may be configured to form an electrostatic discharge path from a second voltage supply line 12 to the input/output pad 100. The second electrostatic protection unit 400 may form a single directional current path from the second voltage supply line 12 to the input/output pad 100. The second electrostatic protection unit 400 may also thereby remove the static electricity generated in the input/output pad 100.

The second voltage supply line 12 may be configured to be supplied with a ground voltage VSS through a second voltage pad.

The semiconductor apparatus 10 may further include the internal circuit 500. The internal circuit 500 may be transferred with a signal from the input/output pad 100. The internal circuit 500 may perform a predetermined internal operation in response to the transferred signal. The internal circuit 500 may transmit an internal signal generated as a result of performing the internal operation, to the input/output pad 100, such that the internal signal may be outputted to the external device.

Figure 2A:
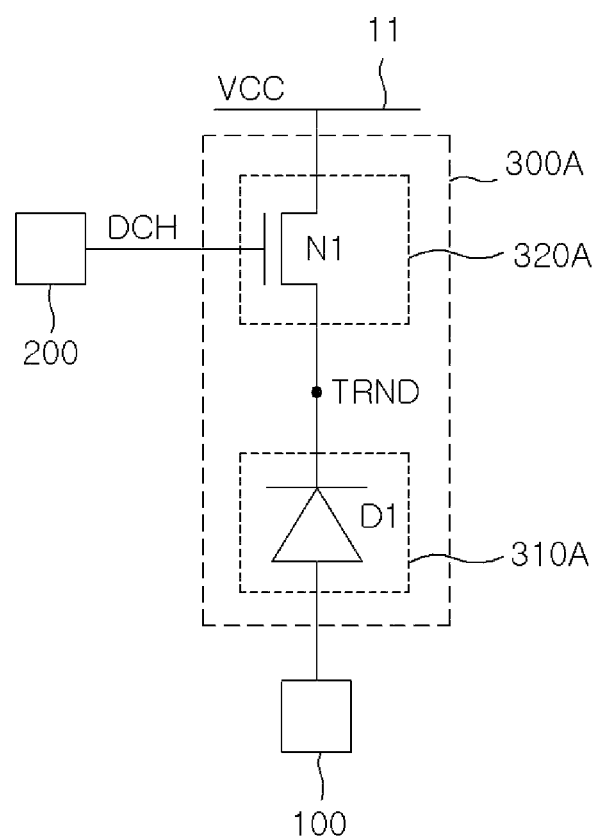
FIG. 2A is a circuit diagram illustrating in detail a representation of an embodiment of the first electrostatic protection unit shown in FIG. 1.

Referring to FIG. 2a, a circuit diagram illustrating in detail a representation of an embodiment 300A of the first electrostatic protection unit 300 shown in FIG. 1 is described.

The first electrostatic protection unit 300A may include a transfer section 310A electrically coupled between the input/output pad 100 and a transfer node TRND. The first electrostatic protection unit 300A may also include a discharge control section 320A electrically coupled between the transfer node TRND and the first voltage supply line 11.

The transfer section 310A may be configured to transfer the static electricity generated in the input/output pad 100, to the transfer node TRND. The transfer section 310A may form a single directional current path from the input/output pad 100 to the transfer node TRND according to the voltage between the input/output pad 100 and the transfer node TRND.

The discharge control section 320A may be configured to discharge the static electricity transferred to the transfer node TRND, to the first voltage supply line 11, in response to the discharge signal DCH. The discharge control section 320A may discharge the static electricity from the transfer node TRND to the first voltage supply line 11 in response to the discharge signal DCH which is enabled. The first electrostatic protection unit 300A may electrically decouple the transfer node TRND and the first voltage supply line 11 in response to the discharge signal DCH that is disabled. For example, the discharge signal DCH may be enabled to a logic high and may be disabled to a logic low.

The transfer section 310A may include a first diode D1. The first diode D1 has the anode which may be electrically coupled to the input/output pad 100. The first diode D1 also has the cathode which may be electrically coupled to the transfer node TRND.

The discharge control section 320A may include a first NMOS transistor N1. The first NMOS transistor N1 has the source and the drain which may be electrically coupled to the transfer node TRND and the first voltage supply line 11, respectively. The first NMOS transistor N1 also has the gate which may be applied with the discharge signal DCH.

Figure 2B:
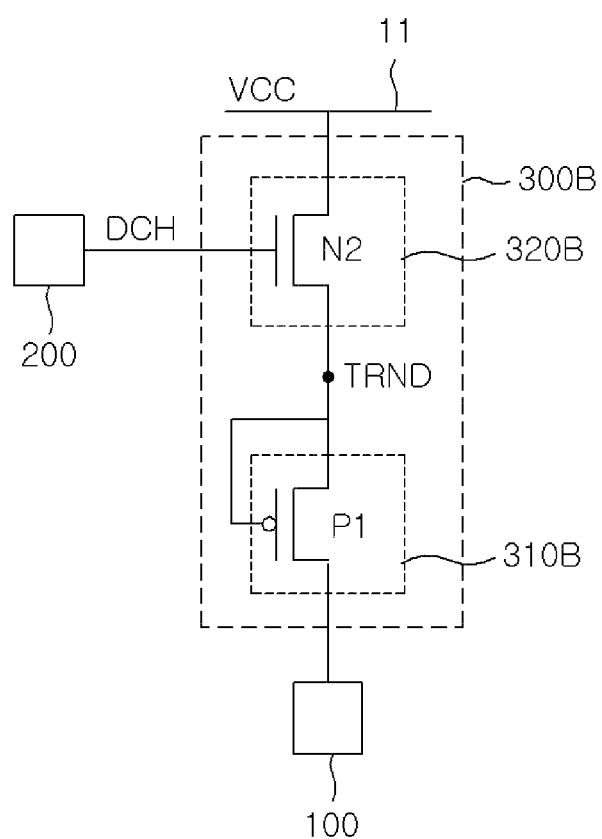
FIG. 2B is a circuit diagram illustrating in detail a representation of an embodiment of the first electrostatic protection unit shown in FIG. 1.

Referring to FIG. 2b, a circuit diagram illustrating in detail a representation of an embodiment of 300B of the first electrostatic protection unit 300 shown in FIG. 1 is described.

The first electrostatic protection unit 300B of FIG. 2b may be configured similarly to the first electrostatic protection unit 300A of FIG. 2a except that a transfer section 3106 includes a PMOS transistor P1 instead of the first diode D1 (see FIG. 2a), and may operate similarly.

The first electrostatic protection unit 300B may include the transfer section 3106 and a discharge control section 320B. The transfer section 3106 may include the PMOS transistor P1. The PMOS transistor P1 has the source and the drain which may be electrically coupled to a transfer node TRND and the input/output pad 100, respectively. The PMOS transistor P1 also has the gate which may be electrically coupled to the transfer node TRND. The discharge control section 320B may include a second NMOS transistor N2.

Figure 3A:
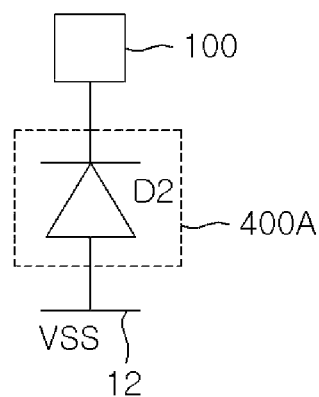
FIG. 3A is a circuit diagram illustrating in detail a representation of an embodiment of the second electrostatic protection unit shown in FIG. 1.

Referring to FIG. 3a, a circuit diagram illustrating in detail a representation of an embodiment 400A of the second electrostatic protection unit 400 shown in FIG. 1 is described.

The second electrostatic protection unit 400A may be configured to form an electrostatic discharge path from the second voltage supply line 12 to the input/output pad 100. The second electrostatic protection unit 400A may form a single directional current path from the second voltage supply line 12 to the input/output pad 100 according to the voltage between the second voltage supply line 12 and the input/output pad 100.

The second electrostatic protection unit 400A may include a second diode D2. The second diode D2 has the anode which may be electrically coupled to the second voltage supply line 12. The second diode D2 also has the cathode which may be electrically coupled to the input/output pad 100.

Figure 3B:
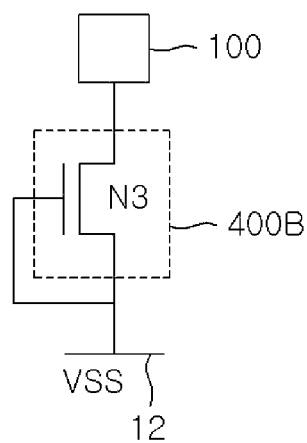
FIG. 3B is a circuit diagram illustrating in detail a representation of an embodiment of the second electrostatic protection unit shown in FIG. 1.

Referring to FIG. 3b, a circuit diagram illustrating in detail a representation of an embodiment 400B of the second electrostatic protection unit 400 shown in FIG. 1 is described.

The second electrostatic protection unit 400B of FIG. 3b may be configured similarly to the second electrostatic protection unit 400A of FIG. 3a except that it includes a third NMOS transistor N3 instead of the second diode D2 (see FIG. 3a), and may operate similarly.

The second electrostatic protection unit 400B may include the third NMOS transistor N3. The third NMOS transistor N3 has the source and the drain which may be electrically coupled to the input/output pad 100 and the second voltage supply line 12. The third NMOS transistor N3 also has the gate which may be electrically coupled to the second voltage supply line 12.

Hereafter, a method to operate the semiconductor apparatus 10 in accordance with an embodiment will be described in detail with reference to FIGS. 1, 2a and 3a.

The operations of the semiconductor apparatus 10 may be divided into a first case where the first electrostatic protection unit 300 is activated in response to the discharge signal DCH which is enabled, to form the electrostatic discharge path from the input/output pad 100 to the first voltage supply line 11. The operations of the semiconductor apparatus 10 may include a second case where the first electrostatic protection unit 300 is deactivated in response to the discharge signal DCH which is disabled. The discharge signal DCH may be inputted in an enabled state through the control pad 200 according to whether the semiconductor apparatus 10 is supplied with a voltage through the first voltage supply line 11.

First, the operation of the semiconductor apparatus 10 in the case where the first electrostatic protection unit 300 is activated in response to the enabled discharge signal DCH is described below.

The semiconductor apparatus 10 may be supplied with the power supply voltage VCC through the first voltage supply line 11 from the external device. The semiconductor apparatus 10 may be supplied with the ground voltage VSS through the second voltage supply line 12. The semiconductor apparatus 10 may be inputted with the enabled discharge signal DCH through the control pad 200 from the external device. The semiconductor apparatus 10 may exchange signals through the input/output pad 100 with the external device.

The first electrostatic protection unit 300 may form the electrostatic discharge path from the input/output pad 100 to the first voltage supply line 11 in response to the enabled discharge signal DCH.

More specifically, the first NMOS transistor N1 of FIG. 2*a* may electrically couple the transfer node TRND and the first voltage supply line 11 in response to the discharge signal DCH which is enabled to the logic high. The first diode D1 may transfer the static electricity generated in the input/output pad 100, to the transfer node TRND. For example, in the case where the level of the signal transmitted between the input/output pad 100 and the internal circuit 500 is equal to or lower than the level of the power supply voltage VCC, that is, in the case where static electricity is not generated, the first diode D1 may be turned off since it is a state in which a reverse bias voltage is applied. The first diode D1 may be turned on in the case where a voltage with a level higher than the power supply voltage VCC is applied to the input/output pad 100, that is, in the case where static electricity is generated, and may then transfer the static electricity to the transfer node TRND. The static electricity transferred to the transfer node TRND may be discharged to the first voltage supply line 11 through the first NMOS transistor N1.

As a result, the internal circuit 500 may accordingly be protected from static electricity.

The second electrostatic protection unit 400 may form the electrostatic discharge path from the second voltage supply line 12 to the input/output pad 100.

In detail, where the level of the signal transmitted between the input/output pad 100 and the internal circuit 500 is equal to or higher than the level of the ground voltage VSS, that is, in the case where static electricity is not generated, the second diode D2 of FIG. 3*a* may be turned off since it is a state in which a reverse bias voltage is applied. The second diode D2 may be turned on where a voltage with a level lower than the ground voltage VSS is applied to the input/output pad 100, that is, in the case where static electricity is generated. The static electricity may be discharged through the second diode D2.

Accordingly, the internal circuit 500 may be protected from static electricity.

Second, the operation of the semiconductor apparatus 10 where the first electrostatic protection unit 300 is deactivated in response to the disabled discharge signal DCH is as follows.

The semiconductor apparatus 10 may not be supplied with the power supply voltage VCC through the first voltage supply line 11 from the external device. In this case, the semiconductor apparatus 10 may be inputted with the disabled discharge signal DCH through the control pad 200 from the external device.

The first electrostatic protection unit 300 may block the electrostatic discharge path from the input/output pad 100 to the first voltage supply line 11 in response to the disabled discharge signal DCH.

More specifically, the first NMOS transistor N1 of FIG. 2*a* may electrically decouple the transfer node TRND and the first voltage supply line 11 in response to the discharge signal DCH which is disabled to the logic low. Since the first NMOS transistor N1 is turned off, it is possible to prevent a forward bias voltage from being applied to the first diode D1 as the power supply voltage VCC is not applied to the first voltage supply line 11. In this instance, discharge from the input/output pad 100 to the first voltage supply line 11 may be prevented.

Figure 4:
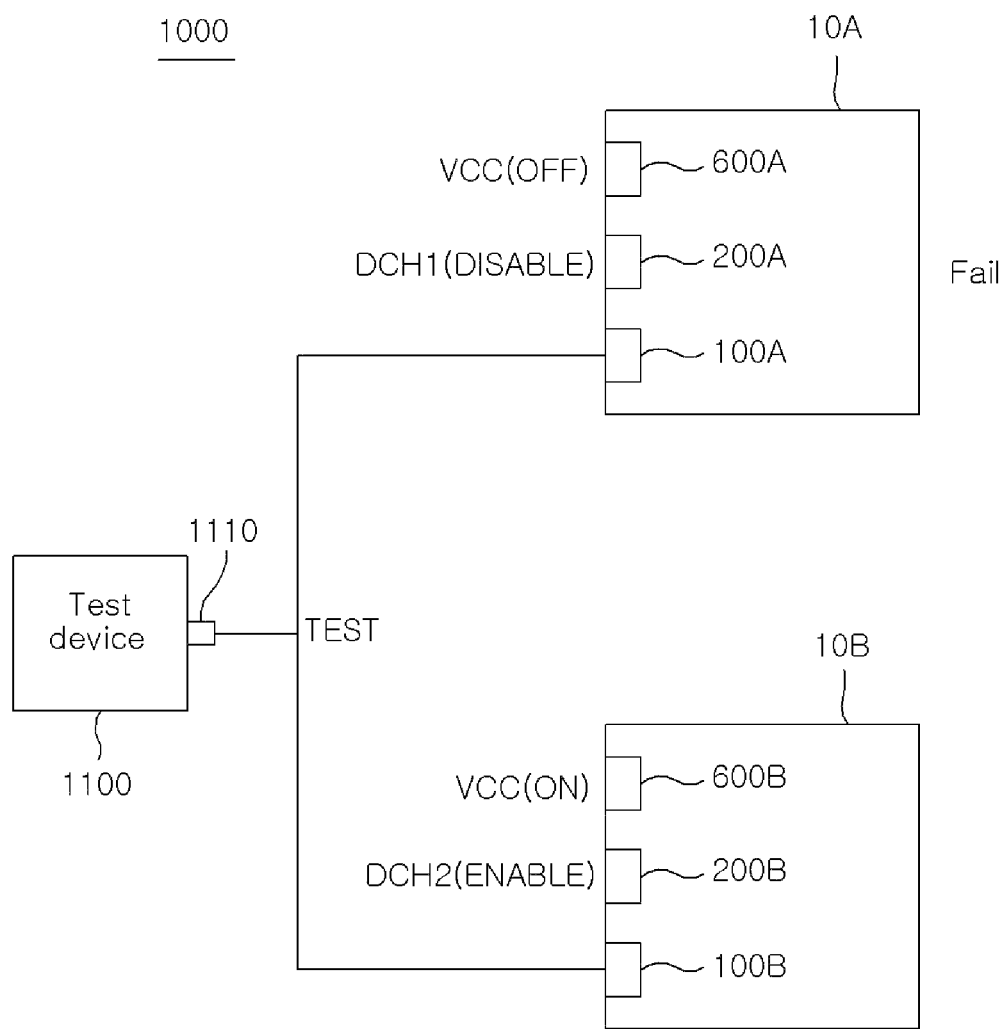
FIG. 4 is a block diagram schematically illustrating a representation of an example of a test system in accordance with an embodiment.

Referring to FIG. 4, a block diagram schematically illustrating a representation of an example of a test system 1000 in accordance with an embodiment is described.

The test system 1000 may include a first semiconductor apparatus 10A, a second semiconductor apparatus 10B, and a test device 1100.

Each of the first and second semiconductor apparatuses 10A and 10B may be configured and operate in substantially the same manner as the semiconductor apparatus 10 of FIG. 1. The respective first and second semiconductor apparatuses 10A and 10B may include input/output pads 100A and 100B for being applied with a test signal TEST. The first and second semiconductor apparatuses 10A and 10B may also include control pads 200A and 200B for being respectively applied with discharge signals DCH1 and DCH2. Further, the first and second semiconductor apparatuses 10A and 10B may include voltage pads 600A and 600B for being supplied with a power supply voltage VCC. The voltage pads 600A and 600B may be electrically coupled with the first voltage supply line 11 shown in FIG. 1. The first and second semiconductor apparatuses 10A and 10B electrically coupled to the test device 1100 may be in a test mode.

The test device 1100 may include a probe card. The test device 1100 may be electrically coupled to the input/output pads 100A and 100B of the first and second semiconductor apparatuses 10A and 10B through a test pin 1110 of the probe card. The first and second semiconductor apparatuses 10A and 10B may share the test pin 1110. Accordingly, the test device 1100 may simultaneously test the first and second semiconductor apparatuses 10A and 10B.

The test device 1100 may supply the power supply voltage VCC to the first and second semiconductor apparatuses 10A and 10B through the voltage pads 600A and 600B. The test device 1100 may apply the discharge signals DCH1 and DCH2 to the first and second semiconductor apparatuses 10A and 10B through the control pads 200A and 200B, respectively. The test device 1100 may apply the test signal TEST to the first and second semiconductor apparatuses 10A and 10B through the input/output pads 100A and 100B.

The test device 1100 may determine whether the first and second semiconductor apparatuses 10A and 10B have failed or not. The test device 1100 may also interrupt the supply of the power supply voltage VCC to a failed semiconductor apparatus. The test device 1100 may retain the supply of the power supply voltage VCC to a remaining semiconductor apparatus.

The test device 1100 may input a discharge signal in an enabled state to each of the first and second semiconductor apparatuses 10A and 10B according to whether the power supply voltage VCC is supplied or not. For example, the test device 1100 may apply a disabled discharge signal to the semiconductor apparatus to which the supply of the power supply voltage VCC is interrupted, that is, the semiconductor apparatus determined as a fail. The test device 1100 may apply an enabled discharge signal to the remaining semiconductor apparatus to which the power supply voltage VCC is supplied.

As a result, when the first and second semiconductor apparatuses 10A and 10B are simultaneously tested by sharing the test pin 1110, in the semiconductor apparatus which is determined as a fail and to which the supply of the power supply voltage VCC is thus interrupted, discharge from an input/output pad to the first voltage supply line 11 is blocked in response to the disabled discharge signal. Further, an influence may not be exerted on the remaining semiconductor apparatus which is being tested.

While it is shown that the test system 1000 of FIG. 4 simultaneously tests two semiconductor apparatuses, it is to be noted that the number of semiconductor apparatuses to be simultaneously tested is not limited to such. In addition, while it is shown in FIG. 4 that two semiconductor apparatuses share the test pin 1110, it is to be noted that the number of semiconductor apparatuses which share the test pin 1110 is not limited to such.

Figure 5:
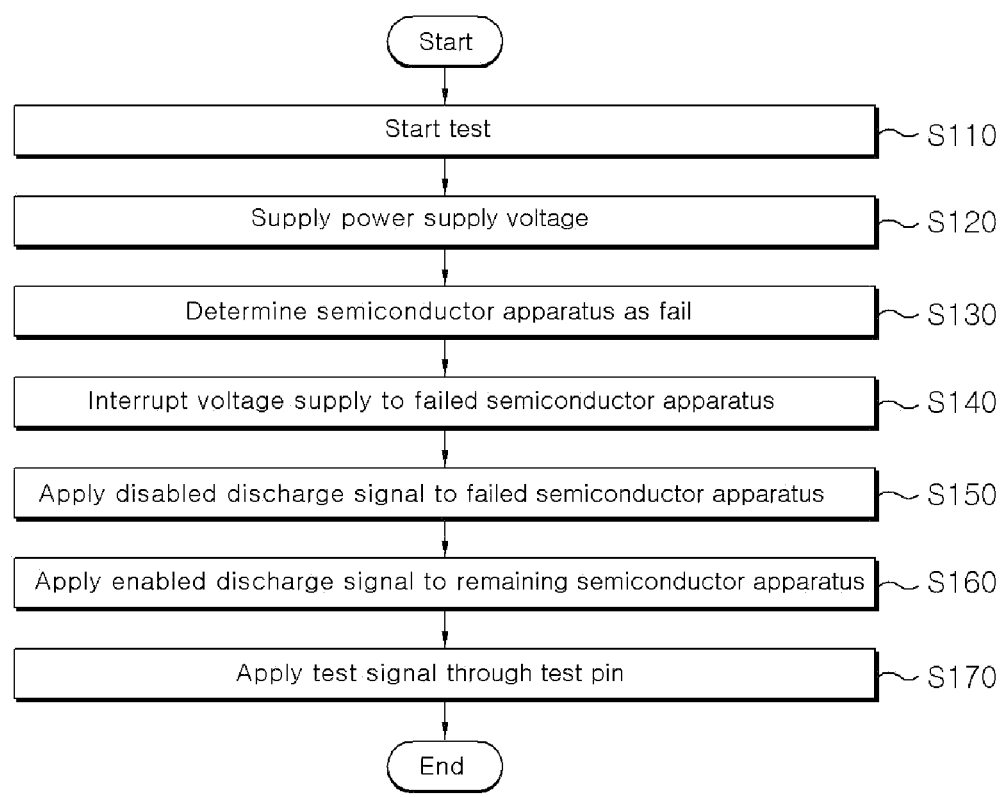
FIG. 5 is a representation of an example of a flow chart to assist in the explanation of a test method in the test system shown in FIG. 4.

Referring to FIG. 5, a representation of an example of a flow chart to assist in the explanation of a test method in the test system 1000 shown in FIG. 4 is described.

Hereinbelow, the test method in the test system 1000 will be described in detail with reference to FIGS. 4 and 5.

In step S110, the test device 1100 may start a test for the first and second semiconductor apparatuses 10A and 10B. The first and second semiconductor apparatuses 10A and 10B may share the test pin 1110 through the input/output pads 100A and 100B.

In step S120, the test device 1100 may supply the power supply voltage VCC to the first and second semiconductor apparatuses 10A and 10B.

In step S130, the test device 1100 may determine a certain semiconductor apparatus as a fail while performing the test. For example, the test device 1100 may determine the first semiconductor apparatus 10A as a fail.

In step S140, the test device 1100 may interrupt the supply of the power supply voltage VCC to the failed semiconductor apparatus. For example, the test device 1100 may interrupt the supply of the power supply voltage VCC to the first semiconductor apparatus 10A which is determined as a fail (see the reference symbol OFF in FIG. 4). The test device 1100 may retain the supply of the power supply voltage VCC to the second semiconductor apparatus 10B (see the reference symbol ON in FIG. 4).

In step S150, the test device 1100 may apply a disabled discharge signal to the failed semiconductor apparatus to which the supply of the power supply voltage VCC is interrupted. For instance, the test device 1100 may apply the discharge signal DCH1 that is disabled to the first semiconductor apparatus 10A. The first electrostatic protection unit 300 of the first semiconductor apparatus 10A may block the electrostatic discharge path from the input/output pad 100A to the first voltage supply line 11 in response to the disabled discharge signal DCH1.

In step S160, the test device 1100 may apply an enabled discharge signal to a remaining semiconductor apparatus except the failed semiconductor apparatus. For instance, the test device 1100 may apply the discharge signal DCH2 which is enabled to the second semiconductor apparatus 10B. The first electrostatic protection unit 300 of the second semiconductor apparatus 10B may form the electrostatic discharge path from the input/output pad 100B to the first voltage supply line 11 in response to the enabled discharge signal DCH2.

In step S170, the test device 1100 may apply the test signal TEST through the test pin 1110. The test signal TEST may be inputted to the first and second semiconductor apparatuses 10A and 10B through the input/output pads 100A and 100B. For example, even though the test signal TEST is applied through the test pin 1110 shared by the first semiconductor apparatus 10A determined as a fail and the second semiconductor apparatus 10B being continuously tested, the voltage level of the test signal TEST may be normally retained because a current path in the first semiconductor apparatus 10A determined as a fail is blocked. Therefore, the test device 1100 may normally perform the test for the second semiconductor apparatus 10B.

In summary, the test system 1000 may efficiently test simultaneously a plurality of semiconductor apparatuses by electrically coupling the plurality of semiconductor apparatuses to share the test pin 1110. The test system 1000 may interrupt the supply of a voltage to a semiconductor apparatus determined as a fail while performing a test. The test system 1000 also prevents discharge through the first electrostatic protection unit of the corresponding failed semiconductor apparatus from the test pin 1110, whereby it is possible to prevent the voltage level of the test signal TEST applied from the test pin 1110, from dropping. Accordingly, the test system 1000 may normally perform the test for a remaining semiconductor apparatus.

A semiconductor apparatus, which is determined as a pass as a test mode is ended and operates in a normal mode, may be applied with an enabled discharge signal through a control pad. In addition, the first electrostatic protection unit thereof may be retained in an activated state and may effectively form an electrostatic discharge path.

Figure 6:
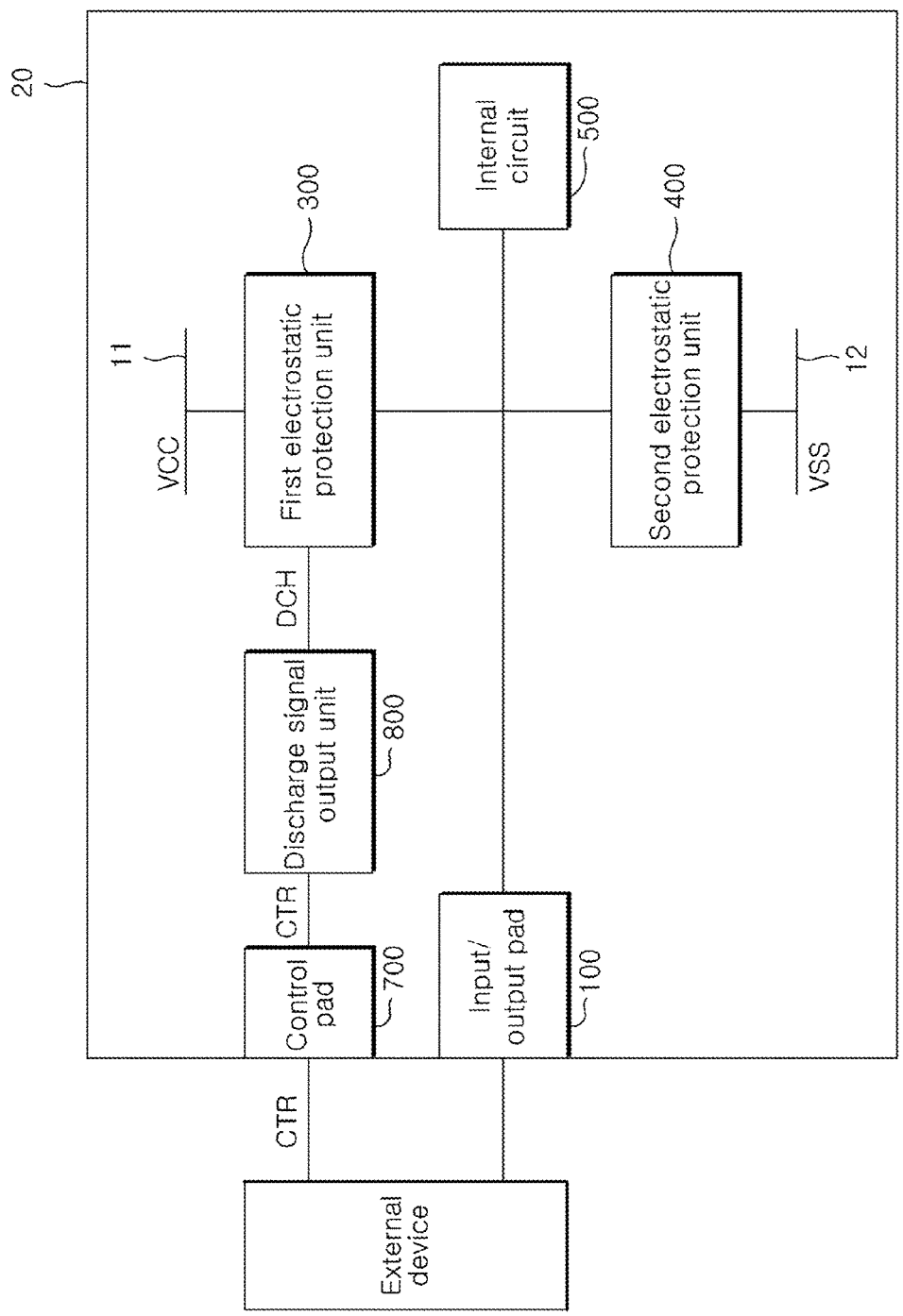
FIG. 6 is a block diagram schematically illustrating a representation of an example of a semiconductor apparatus in accordance with an embodiment.

Referring to FIG. 6, a block diagram schematically illustrating a representation of an example of a semiconductor apparatus 20 in accordance with an embodiment is described. In FIG. 6, the same reference numerals as in FIG. 1 will be used to refer to substantially the same component elements as the component elements of the semiconductor apparatus 10 described above with reference to FIG. 1. In addition, detailed descriptions for the corresponding component elements will be omitted herein.

The semiconductor apparatus 20 may include an input/output pad 100, a control pad 700, a discharge signal output unit 800, a first electrostatic protection unit 300, a second electrostatic protection unit 400, and an internal circuit 500.

The control pad 700 may be configured to transfer a control signal CTR inputted from an external device, to the discharge signal output unit 800, in a test mode in which a test for the semiconductor apparatus 20 is performed. In the test mode, the control signal CTR may be enabled according to whether a voltage is supplied to a first voltage supply line 11 or not. In the test mode, the control signal CTR may correspond to the discharge signal DCH of FIG. 1. The control pad 700 may be floated when the test mode is ended.

The discharge signal output unit 800 may be configured to output a discharge signal DCH in response to the control signal CTR in the test mode. For example, the discharge signal output unit 800 may output the discharge signal DCH which is enabled according to the control signal CTR which is enabled in the test mode. The discharge signal output unit 800 may output the discharge signal DCH which is disabled according to the control signal CTR which is disabled in the test mode. The discharge signal output unit 800 may retain the level of the discharge signal DCH in an enabled state when the test mode is ended. More specifically, the discharge signal output unit 800 may output the enabled discharge signal DCH in the case where the control pad 700 is floated.

Accordingly, the semiconductor apparatus 20 of FIG. 6 may use the control pad 700 only in the test mode unlike the semiconductor apparatus 10 of FIG. 1. The discharge signal output unit 800 may output the discharge signal DCH to activate the first electrostatic protection unit 300 in response to the control signal CTR in the test mode. The control pad 700 may be floated when the test mode is ended. For example, the control pad 700 may be floated where the semiconductor apparatus 20 is in a state in which it passes the test and is placed on the market. In this case, the discharge signal output unit 800 may output the enabled discharge signal DCH by itself such that the first electrostatic protection unit 300 normally retains an activated state.

As is apparent from the above descriptions, the test system in accordance with an embodiment may efficiently test simultaneously a plurality of semiconductor apparatuses.

While various embodiments have been described above, it will be understood to those skilled in the art that the embodiments described are by way of example only. Accordingly, the semiconductor apparatus and the test system including the same described should not be limited based on the described embodiments.

What is claimed is:

1. A semiconductor apparatus comprising:
   an input/output pad configured to exchange signals with an external device;
   a control pad configured to be inputted with a discharge signal from the external device; and
   a first electrostatic protection unit configured to form an electrostatic discharge path from the input/output pad to a first voltage supply line in response to the discharge signal,
   wherein the discharge signal is independent of the signals inputted to the input/output pad, and
   wherein the electrostatic discharge path is a single directional current path blocking a current from the first voltage supply line to the input/output pad,
   wherein the first electrostatic protection unit comprises:
   a transfer section configured to transfer static electricity generated in the input/output pad to a transfer node; and
   a discharge control section configured to discharge the static electricity transferred to the transfer node to the first voltage supply line in response to the discharge signal.

2. The semiconductor apparatus according to claim 1, wherein the transfer section forms the single directional current path from the input/output pad to the transfer node according to a voltage between the input/output pad and the transfer node.

3. The semiconductor apparatus according to claim 1, wherein the first voltage supply line is supplied with a positive voltage.

4. The semiconductor apparatus according to claim 1, further comprising:

a second electrostatic protection unit configured to form an electrostatic discharge path from a second voltage supply line to the input/output pad.

5. The semiconductor apparatus according to claim 4, wherein the second voltage supply line is supplied with a ground voltage.

6. A semiconductor apparatus comprising:
   an input/output pad configured to exchange signals with an external device;
   a control pad configured to be inputted with a control signal from the external device in a test mode;
   a discharge signal output unit configured to output a discharge signal in response to the control signal; and
   a first electrostatic protection unit configured to form an electrostatic discharge path from the input/output pad to a first voltage supply line in response to the discharge signal,
   wherein the control signal is independent of the signals inputted to the input/output pad, and
   wherein the electrostatic discharge path is a single directional current path blocking a current from the first voltage supply line to the input/output pad.

7. The semiconductor apparatus according to claim 6, wherein the control pad is floated when the test mode has ended.

8. The semiconductor apparatus according to claim 6, wherein the discharge signal output unit outputs the discharge signal which is enabled when the control pad is floated.

9. The semiconductor apparatus according to claim 6, wherein the first electrostatic protection unit comprises:
   a transfer section configured to transfer static electricity generated in the input/output pad to a transfer node; and
   a discharge control section configured to discharge the static electricity transferred to the transfer node to the first voltage supply line in response to the discharge signal.

10. The semiconductor apparatus according to claim 9, wherein the transfer section forms the single directional current path from the input/output pad to the transfer node according to a voltage between the input/output pad and the transfer node.

11. The semiconductor apparatus according to claim 6, wherein the first voltage supply line is supplied with a positive voltage.

12. The semiconductor apparatus according to claim 6, further comprising:
   a second electrostatic protection unit configured to form an electrostatic discharge path from a second voltage supply line to the input/output pad.

13. The semiconductor apparatus according to claim 12, wherein the second voltage supply line is supplied with a ground voltage.

* * * * *